(12) United States Patent
Sasao et al.

(10) Patent No.: US 11,178,753 B2
(45) Date of Patent: Nov. 16, 2021

(54) SWITCH DEVICE (71) Applicant: SANYO Electric Co., Ltd., Daito (JP)

(72) Inventors: Hideyuki Sasao, Hyogo (JP); Takashi Imasato, Hyogo (JP)

(73) Assignee: SANYO Electric Co., Ltd., Daito (JP)

(*) Notice: Subject to any disclaimer, the term of this patent is extended or adjusted under 35 U.S.C. 154(b) by 17 days.

(21) Appl. No.: 16/326,538

(22) PCT Filed: May 10, 2017

(86) PCT No.: PCT/JP2017/017625
§ 371 (c)(1),
(2) Date: Feb. 19, 2019

(87) PCT Pub. No.: WO2018/047407
PCT Pub. Date: Mar. 15, 2018

(65) Prior Publication Data
US 2019/0191550 A1  Jun. 20, 2019

(30) Foreign Application Priority Data
Sep. 6, 2016 (JP) .............................. JP2016-174091

(51) Int. Cl.
*H05K 1/02* (2006.01)
*H05K 3/34* (2006.01)
(Continued)

(52) U.S. Cl.
CPC ........... *H05K 1/0263* (2013.01); *H01R 12/58* (2013.01); *H03K 17/687* (2013.01);
(Continued)

(58) Field of Classification Search
CPC .. H05K 7/04; H05K 7/06; H05K 7/14; H05K 2201/10272; H05K 2201/10409;
(Continued)

(56) References Cited

U.S. PATENT DOCUMENTS 3,838,203 A * 9/1974 Brandlein ............... H01R 4/027
                                                    174/263
5,434,749 A * 7/1995 Nakayama ............. H01R 12/62
                                                    174/261
(Continued)

FOREIGN PATENT DOCUMENTS

JP    2-292889 A     12/1990
JP    05205791 A  *  8/1993  ........... H05K 1/0213
(Continued)

OTHER PUBLICATIONS

International Search Report dated Aug. 15, 2017, issued in counterpart application No. PCT/JP2017/017625 (2 pages).
(Continued)

*Primary Examiner* — Tuan T Dinh
(74) *Attorney, Agent, or Firm* — Westerman, Hattori, Daniels & Adrian, LLP (57) ABSTRACT

Bus bars are soldered to a wiring pattern of a printed board to which the bus bars are connected, and the bus bars are screwed to the printed board. Tips of bolts passing through holes in the bus bars and holes in the punted board may be tightened using nuts. The holes in the printed board may be electrically connected to the wiring pattern.

2 Claims, 5 Drawing Sheets (51) Int. Cl.
*H01R 12/58* (2011.01)
*H03K 17/687* (2006.01)
*H05K 1/18* (2006.01)
*H01R 12/53* (2011.01)
*B60R 16/03* (2006.01)

(52) U.S. Cl.
CPC .......... *H03K 17/6874* (2013.01); *H05K 1/02* (2013.01); *H05K 1/181* (2013.01); *H05K 3/34* (2013.01); *B60R 16/03* (2013.01); *H01R 12/53* (2013.01); *H03K 2217/0009* (2013.01); *H05K 2201/10166* (2013.01); *H05K 2201/10272* (2013.01); *H05K 2201/10409* (2013.01); *H05K 2201/10522* (2013.01)

(58) Field of Classification Search
CPC .. H05K 1/00; H05K 1/02; H05K 1/18; H05K 1/181; H01M 7/00
USPC ........ 361/699–715, 775–777, 803, 807–810; 439/76.2
See application file for complete search history.

(56) References Cited

U.S. PATENT DOCUMENTS

| | | | | |
|---|---|---|---|---|
| 5,956,231 A * | 9/1999 | Yamada | ................ | H01L 23/049 361/728 |
| 6,061,230 A * | 5/2000 | Mazzella | ................ | H02B 1/21 174/70 B |
| 6,175,509 B1 * | 1/2001 | Koch | ................ | H05K 1/141 361/809 |
| 6,302,709 B1 * | 10/2001 | Ross | ................ | H01R 4/34 439/78 |
| 6,459,146 B2 * | 10/2002 | Kono | ................ | H01L 24/49 257/676 |
| 8,094,461 B2 * | 1/2012 | Tagano | ................ | H05K 3/3447 361/775 |
| 9,999,145 B2 * | 6/2018 | Chi | ................ | H01L 23/053 |
| 2002/0025709 A1 * | 2/2002 | Murakami | ................ | H02B 1/20 439/251 |
| 2006/0192509 A1 * | 8/2006 | Nakakita | ................ | H05K 7/1432 318/139 |
| 2008/0146092 A1 * | 6/2008 | Taylor | ................ | H05K 3/325 439/883 |
| 2010/0148298 A1 * | 6/2010 | Takano | ................ | H01L 25/072 257/500 |
| 2011/0221268 A1 | 9/2011 | Kanazawa et al. | | |
| 2015/0138733 A1 * | 5/2015 | Tsuda | ................ | H01L 23/04 361/733 |
| 2017/0105306 A1 | 4/2017 | Takahashi et al. | | |
| 2018/0026381 A1 | 1/2018 | Haraguchi | | |

FOREIGN PATENT DOCUMENTS

| | | | | |
|---|---|---|---|---|
| JP | 06291437 A * | 10/1994 | ............. | H05K 3/202 |
| JP | H07-154057 A | 6/1995 | | |
| JP | 2016-10259 A | 1/2016 | | |
| JP | 2016-92853 A | 5/2016 | | |
| JP | 2016-158372 A | 9/2016 | | |
| WO | 2010/047366 A1 | 4/2010 | | |

OTHER PUBLICATIONS

English Translation of Search Report dated Dec. 29, 2020, issued in counterpart to CN Application No. 201780054612.0. (2 pages).

* cited by examiner

SWITCH DEVICE

TECHNICAL FIELD

The present invention relates to a method for connecting a bus bar to a printed board, a printed board to which a bus bar is connected, and a switch device that uses a printed board to which a bus bar is connected.

BACKGROUND ART

Nowadays, vehicles are equipped with auxiliary batteries (commonly, lead storage batteries), and such auxiliary batteries supply electric power to starter motors and various electric devices (see PTL 1, for example). A mechanical relay is popularly used for a switch for turning on and off an auxiliary battery. Recently, there have been attempts to use a semiconductor switch (for example, metal-oxide-semiconductor field-effect transistor (MOSFET)) which is less noisy than the mechanical relay. The semiconductor switch needs to be mounted on a circuit board for use. The circuit board equipped with the semiconductor switch is commonly connected to an auxiliary battery and a power supply line with bus bars to achieve a robust design which can withstand high currents.

CITATION LIST

Patent Literature

PTL 1: Unexamined Japanese Patent Publication No. 2016-92853

SUMMARY OF THE INVENTION

In general, a bus bar is connected to a circuit board by soldering. The soldered part receives stress such as vibrations, impacts, and distortions upon assembly. Particularly for on-vehicle use, great vibrations or impacts frequently occur. When excessive stress is continuously exerted on the soldered part for a long time, a crack is likely to occur in the solder, and disconnection may finally occur.

The present invention has been accomplished in view of the abovementioned circumstances, and an object of the present invention is to provide a technique for firmly connecting a bus bar to a circuit board.

To address the abovementioned problem, a printed board according to one aspect of the present invention is a printed board to which a bus bar is connected, wherein the bus bar is soldered to a wiring pattern, and the bus bar is screwed to the printed board.

Any desired combinations of the above-described configuration elements and converted expressions of the present invention in methods, devices, systems, and other similar entities are still effective as aspects of the present invention.

According to the present invention, the bus bar can be firmly connected to the circuit board.

DESCRIPTION OF EMBODIMENT

Figure 1:
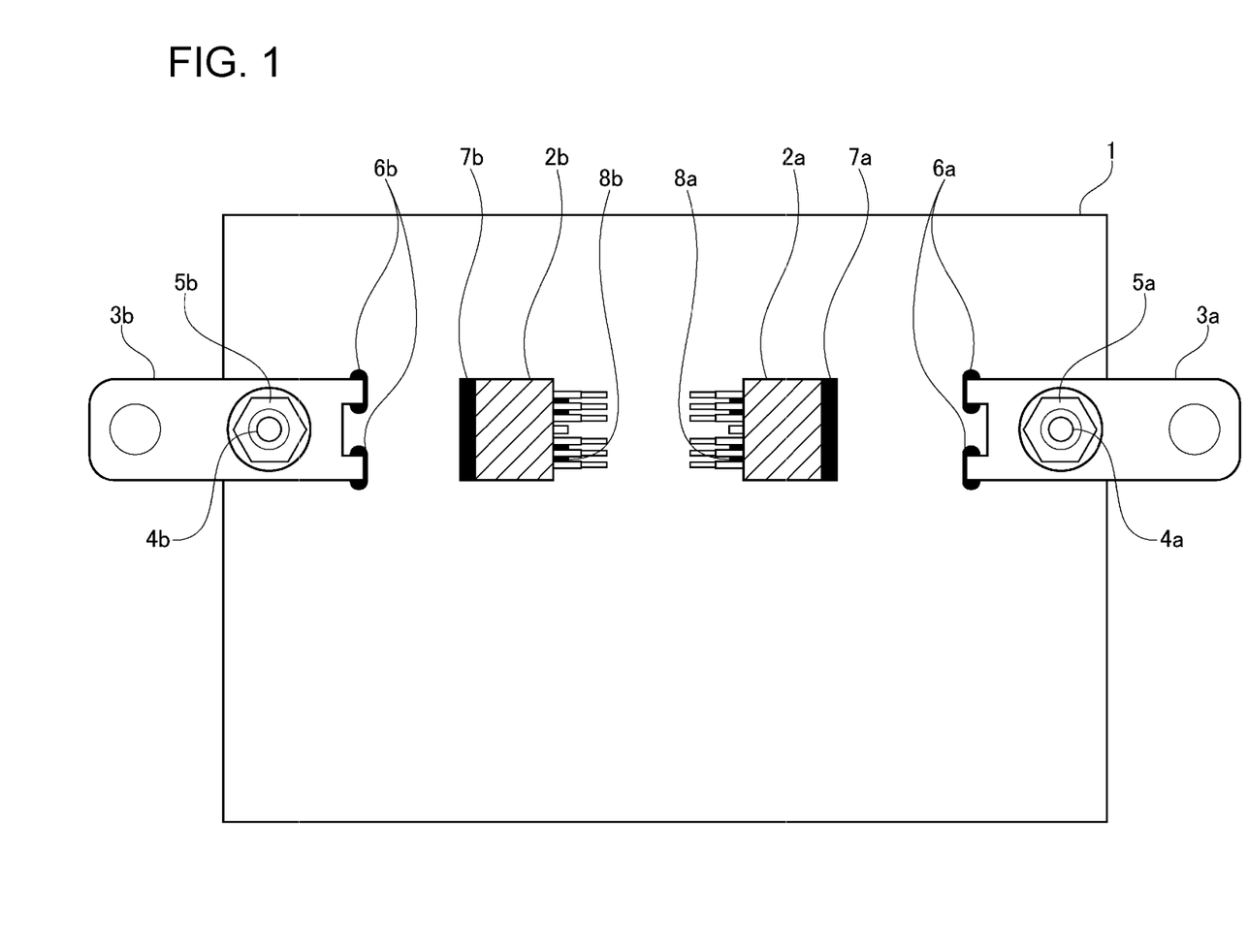
FIG. 1 is a plan view schematically showing a front surface of a printed board according to an exemplary embodiment of the present invention.

FIG. 1 is a plan view schematically showing a front surface of printed board 1 according to an exemplary embodiment of the present invention. First semiconductor switch element 2a and second semiconductor switch element 2b are mounted on the front surface of printed board 1 according to the present exemplary embodiment. Hereinafter, an example of using a MOSFET as the semiconductor switch elements will be described. First semiconductor switch element 2a and second semiconductor switch element 2b are disposed along the longitudinal direction of printed board 1 and constitute a series circuit. In the MOSFET, a parasitic diode is formed between a source and a drain. Therefore, even when the MOSFET is turned off, a current flowing from the source terminal cannot be shut off. To shut off a bidirectional current, a bidirectional switch is generally constituted by connecting two MOSFETs which are directed in opposite directions in series.

First bus bar 3a and second bus bar 3b are respectively connected to both ends of printed board 1 in the longitudinal direction. First bus bar 3a and second bus bar 3b are soldered to a wiring pattern of printed board 1 and screwed to printed board 1. First soldered part 6a of printed board 1 has two holes into which bent parts formed on a left side and a right side of a tip of first bus bar 3a are inserted. The bent parts formed on the left side and the right side of the tip of first bus bar 3a are bent at a right angle with respect to a body part of first bus bar 3a and inserted into two holes in first soldered part 6a of printed board 1.

Figure 2:
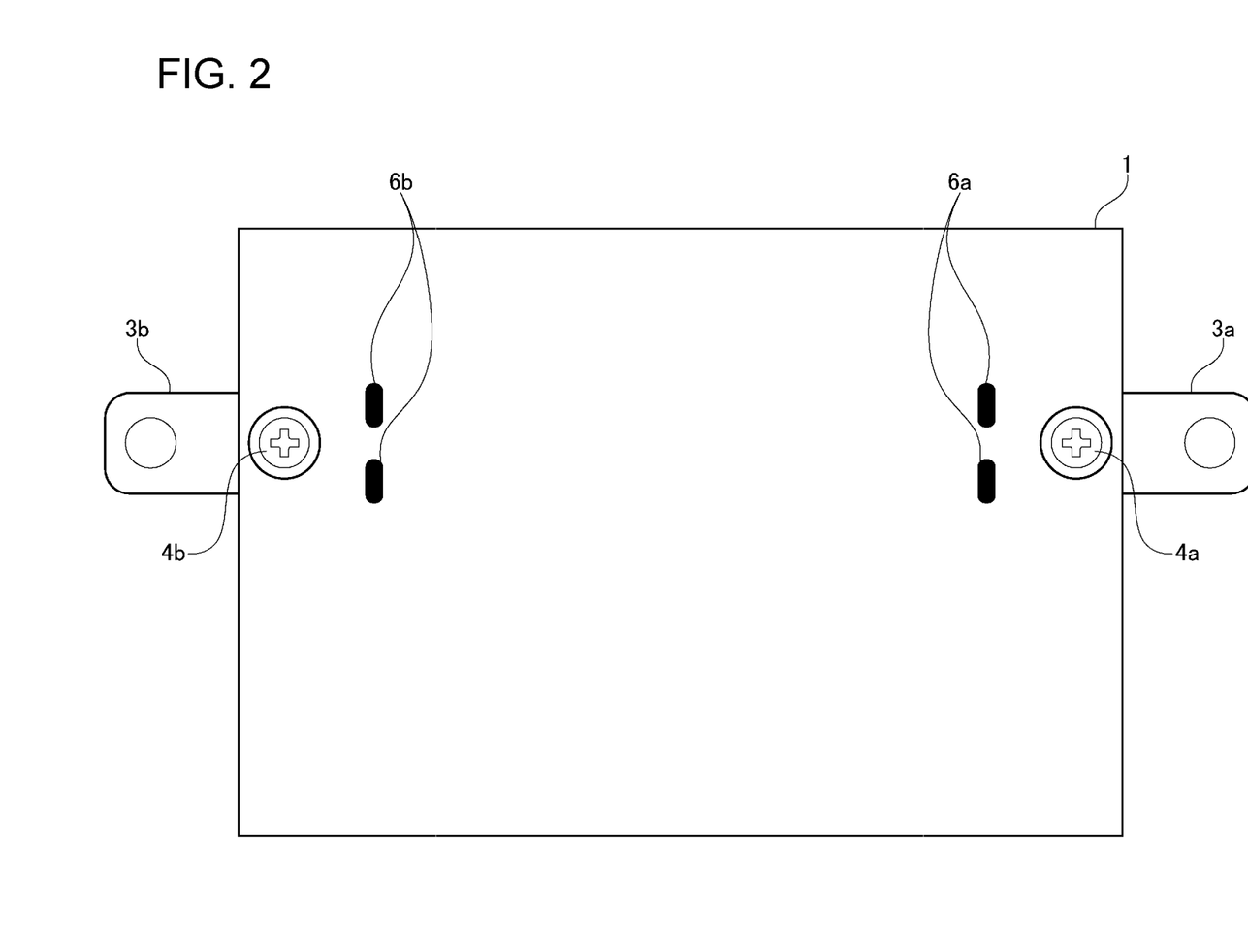
FIG. 2 is a plan view schematically showing a back surface of the printed board according to the exemplary embodiment of the present invention.

FIG. 2 is a plan view schematically showing a back surface of printed board 1 according to the exemplary embodiment of the present invention. The two bent parts of first bus bar 3a inserted into the two holes in first soldered part 6a of printed board 1 are fixed to the two holes by soldering. Note that the tips of the two bent parts protrude from the back surface as shown in FIG. 2.

After the bent parts of first bus bar 3a are fixed to first soldered part 6a, first bolt 4a is passed through a screw hole in first bus bar 3a and a first screw hole in printed board 1, and a tip of first bolt 4a is tightened using first nut 5a. The two holes in first soldered part 6a and the first screw hole in printed board 1 are formed at positions corresponding to the positions of the two bent parts of first bus bar 3a and the screw hole in first bus bar 3a. In the example shown in FIGS. 1 and 2, first bolt 4a is inserted from the back surface side of printed board 1, and fixed with first nut 5a on the front surface of printed board 1. In contrast, first bolt 4a may be inserted from the front surface side of printed board 1 and fixed with first nut 5a on the back surface of printed board 1.

Note that first bolt 4a may be fixed to the first screw hole in printed board 1 by soldering without using first nut 5a. Further, first bolt 4a tightened with first nut 5a may be further soldered to enhance contact strength.

Similarly, second soldered part 6b of printed board 1 has two holes into which bent parts formed on a left side and a right side of a tip of second bus bar 3b are inserted. The two bent parts of second bus bar 3b are fixed to two holes formed in second soldered part 6b of printed board 1 by soldering. Then, second bolt 4b is passed through a screw hole in second bus bar 3b and a second screw hole in printed board 1, and a tip of second bolt 4b is tightened using second nut 5b. First bolt 4a and second bolt 4b to be used are made of a conductive material such as copper.

Figure 3:
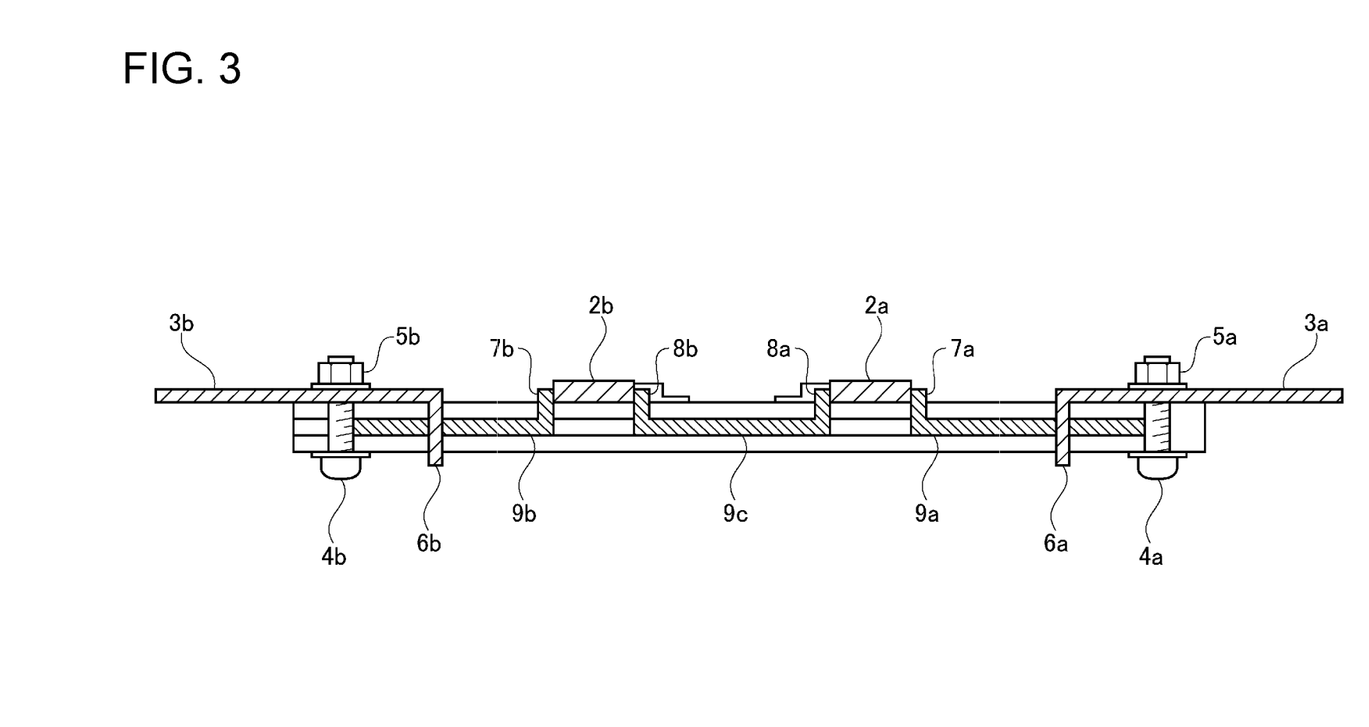
FIG. 3 is a schematic sectional view of the printed board according to the exemplary embodiment of the present invention.

FIG. 3 is a schematic sectional view of printed board 1 according to the exemplary embodiment of the present invention. Printed board 1 has a wiring pattern formed thereon. The wiring pattern is formed of a conductive material such as a copper foil. First soldered part 6a and first drain terminal 7a of first semiconductor switch element 2a are electrically connected via first conductive layer 9a. First conductive layer 9a extends to the first screw hole in printed board 1 and is electrically connected to first bolt 4a. An inner wall surface of the first screw hole may be treated with copper plating. Insulating layers are formed over and under first conductive layer 9a. The front surface and back surface of printed board 1 are covered with a protective coating film.

Similarly, second soldered part 6b and second drain terminal 7b of second semiconductor switch element 2b are electrically connected via second conductive layer 9b. Second conductive layer 9b extends to the second screw hole in printed board 1 and is electrically connected to second bolt 4b. An inner wall surface of the second screw hole may also be treated with copper plating. Insulating layers are also formed over and under second conductive layer 9b.

First source terminal 8a of first semiconductor switch element 2a and second source terminal 8b of second semiconductor switch element 2b are electrically connected via third conductive layer 9c. Insulating layers are formed over and under third conductive layer 9c. Further, first conductive layer 9a, second conductive layer 9b, and third conductive layer 9c are separated from each other by an insulating wall and electrically isolated from each other. Printed board 1 also has a wiring pattern for supplying power to first semiconductor switch element 2a and second semiconductor switch element 2b and a wiring pattern for supplying a drive signal to gate terminals of first semiconductor switch element 2a and second semiconductor switch element 2b, and these wiring patterns are not illustrated in FIGS. 1 to 3.

Figure 4A:
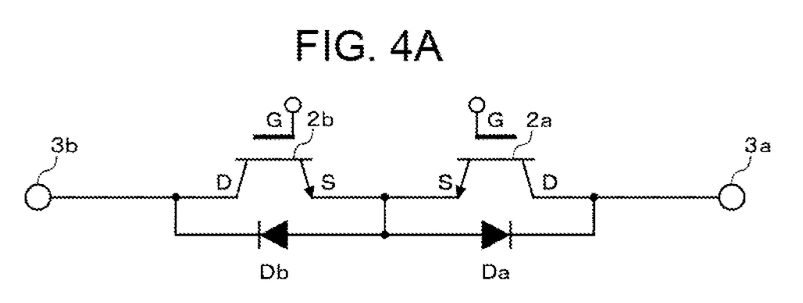
FIGS. 4A and 4B are diagrams showing a circuit configuration of a bidirectional switch device.
Figure 4B:
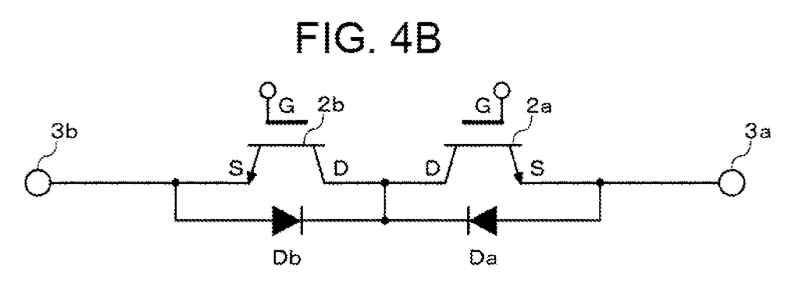

FIGS. 4A and 4B are diagrams Showing a circuit configuration of a bidirectional switch device. FIG. 4A shows the circuit configurations of first semiconductor switch element 2a and second semiconductor switch element 2b mounted on printed board 1 shown in FIGS. 1 to 3. The drain terminal of first semiconductor switch element 2a is connected to first bus bar 3a, the drain terminal of second semiconductor switch element 2b is connected to second bus bar 3b, and the source terminal of first semiconductor switch element 2a and the source terminal of second semiconductor switch element 2b are connected to each other.

First parasitic diode Da is formed between the source and the drain of first semiconductor switch element 2a, second parasitic diode Db is formed between the source and the drain of second semiconductor switch element 2b, and an anode of first parasitic diode Da and an anode of second parasitic diode Db face each other.

When this bidirectional switch device is controlled to be ON, a high-level drive signal (ON signal) is input to the gate terminals of first semiconductor switch element 2a and second semiconductor switch element 2b. On the other hand, when the bidirectional switch device is controlled to be OFF, a low-level drive signal (OFF signal) is input to the gate terminals of first semiconductor switch element 2a and second semiconductor switch element 2b. The anodes of first parasitic diode Da and second parasitic diode Db face each other, and thus, a current through first parasitic diode Da and second parasitic diode Db does not flow in either direction.

FIG. 4B shows a circuit configuration where the orientations of first semiconductor switch element 2a and second semiconductor switch element 2b in FIG. 4A are reversed. The source terminal of first semiconductor switch element 2a is connected to first bus bar 3a, the source terminal of second semiconductor switch element 2b is connected to second bus bar 3b, and the drain terminal of first semiconductor switch element 2a and the drain terminal of second semiconductor switch element 2b are connected to each other.

First parasitic diode Da is formed between the source and the drain of first semiconductor switch element 2a, second parasitic diode Db is formed between the source and the drain of second semiconductor switch element 2b, and a cathode of first parasitic diode Da and a cathode of second parasitic diode Db face each other. Therefore, when first semiconductor switch element 2a and second semiconductor switch element 2b are OFF, a current through first parasitic diode Da and second parasitic diode Db does not flow in either direction.

As described above, according to the present exemplary embodiment, the bus bars are soldered and screwed to the printed board, whereby a joint strength between the bus bars and the printed board can be improved. If the bus bars are fixed to the printed board only by soldering, a mechanical strength is insufficient, and a countermeasure against stress is needed. Conceivable countermeasures against stress include using a flexible bus bar and using a harness as a bus bar. However, the former entails a significant increase in cost, and the latter entails an increase in diameter of the harness.

In addition, if the bus bars are fixed to the printed board only with screws, an electrical connection between the bus bars and the wiring patterns in the printed board becomes insufficient. Moreover, the structure of screwing the bus bars to the printed board generates lower torque than the structure of screwing the bus bars (metals) to each other.

Meanwhile, according to the present exemplary embodiment, the bus bars are joined to the printed board by soldering and with screws, whereby an electrical connection between the bus bars and the printed board can be ensured and a mechanical strength can also be ensured.

Further, the conductive bolts to be used for screwing and the wiring pattern are brought into contact with each other, whereby a current flow area can be increased. This enables a flow of a higher current. In addition, if a current value is the same, a resistance value is decreased, whereby generation of heat can be reduced. Thermal stress exerted on the solder can also be reduced, whereby reliability can be improved.

In addition, screwing is performed first, and then, soldering is performed. This can prevent positional misalignment between the screw holes in first bus bar 3a and second bus bar 3b and the first and second screw holes in printed board 1. If the soldering is performed first, a slight misalignment may occur between the screw holes in first bus bar 3a and second bus bar 3b and the first and second screw holes in printed board 1. Further, if the soldering is performed first, a gap may be formed between first and second bus bars 3a and 3b and printed board 1. When first bus bar 3a and second bus bar 3b are screwed to printed board 1 while having a partial loss of contact with printed board 1, first bus bar 3a and second bus bar 3b may be pressed against printed board 1 and deformed. With this state, stress corresponding to the deformation of first bus bar 3*a* and second bus bar 3*b* is exerted on the soldered parts. On the other hand, if the screwing is performed first, and then, the soldering is performed, the formation of a gap between first and second bus bars 3*a* and 3*b* and printed board 1 can be prevented, and application of stress on the soldered parts can be prevented.

Hereinafter, an application example of the abovementioned bidirectional switch device will be described. The bidirectional switch device described above has resistance to vibrations, impacts, and hot environments, and can perform switching of a high current, and thus, it is suitable for use on vehicles.

Figure 5:
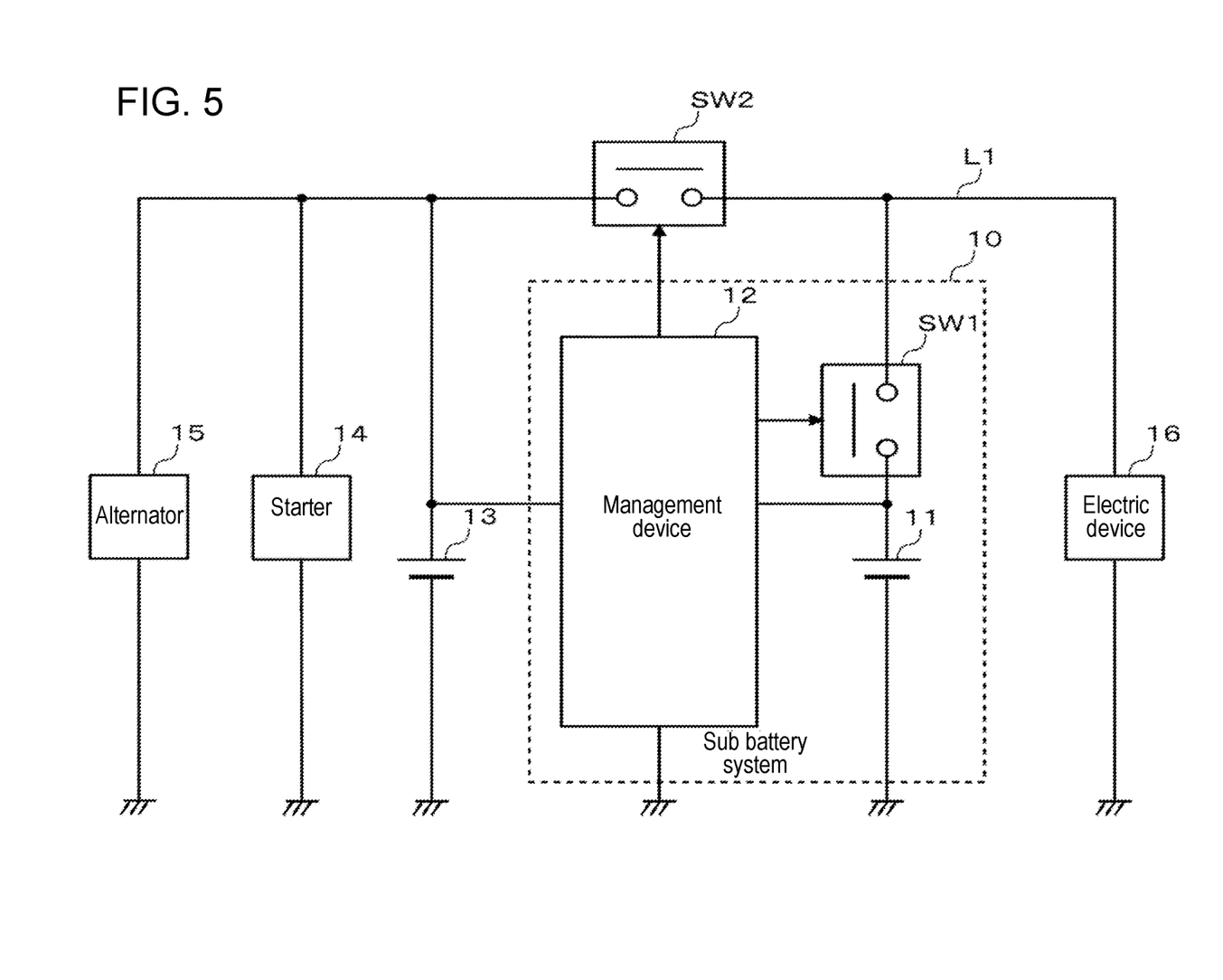
FIG. 5 is a diagram for describing a vehicle power supply system using the bidirectional switch device according to the exemplary embodiment of the present invention.

FIG. 5 is a diagram for describing a vehicle power supply system using the bidirectional switch device according to the exemplary embodiment of the present invention. The vehicle power supply system includes a lead storage battery 13 and a sub battery system 10 for supplementing lead storage battery 13. A vehicle equipped with lead storage battery 13 and sub battery system 10 is equipped with starter 14, alternator 15, and electric device 16 as components associated with lead storage battery 13 and sub battery system 10.

Starter 14 is a motor for starting an engine. Starter 14 rotates with power supplied from lead storage battery 13 to start the engine. When an ignition switch (not illustrated) is turned on by an operation performed by a driver, power is supplied from lead storage battery 13 to starter 14 through power supply line L1, and thus, starter 14 is started. Alternator 15 generates power by rotational energy of a crankshaft of the engine. The power which is generated by alternator 15 is supplied to lead storage battery 13 and/or sub battery system 10 through power supply line L1.

Electric device 16 is a general term which indicates various kinds of electric loads (auxiliaries) mounted on the vehicle, such as a headlight, a power steering, an oil pump, a car navigation system, and an audio. For convenience of description, starter 14 and alternator 15 are illustrated separately from electric device 16 in the present specification. Electric device 16 is activated with the power supplied from lead storage battery 13 and/or sub battery system 10 through power supply line L1.

Lead storage battery 13 is a main battery which stores power generated by alternator 15 and supplies the power to starter 14 and electric device 16. Sub battery system 10 includes nickel-hydrogen storage battery 11, management device 12, and first switch device SW1. Nickel-hydrogen storage battery 11 is a sub battery that stores power generated by alternator 15 and supplies the power to electric device 16. Nickel-hydrogen storage battery 11 is designed to have a capacity lower than a capacity of lead storage battery 13. Lead storage battery 13 and nickel-hydrogen storage battery 11 are connected in parallel.

Lead storage battery 13 has beneficial features such as being relatively inexpensive, being operable in a relatively wide temperature range, and having a high output, and thus has been widely used as a storage battery for vehicles. However, lead storage battery 13 has disadvantages of having low energy efficiency upon charging and discharging, being less resistant to overdischarge, and having a short cycle life. Nickel-hydrogen storage battery 11 has beneficial features such as having relatively high energy efficiency upon charging and discharging, being resistant to overcharge and overdischarge, being operable in a wide temperature range, having a wide state of charge (SOC) range, and having a relatively long cycle life.

Note that a lithium ion storage battery may be used in place of nickel-hydrogen storage battery 11. The lithium ion storage battery is a high-performance storage battery having high energy density and high energy efficiency upon charging and discharging. However, the lithium ion storage battery needs to have tight voltage and temperature control. In place of nickel-hydrogen storage battery 11, a capacitor such as an electric double layer capacitor or a lithium ion capacitor may be used.

First switch device SW1 is inserted between a positive electrode of nickel-hydrogen storage battery 11 and power supply line L1. Second switch device SW2 is inserted between a node of power supply line L1 closer to lead storage battery 13 and a node of power supply line L1 closer to nickel-hydrogen storage battery 11. The bidirectional switch device according to the exemplary embodiment is used for first switch device SW1 and/or second switch device SW2. When the bidirectional switch device is used for first switch device SW1, first bus bar 3*a* fixed to printed board 1 is connected to power supply line L1, and second bus bar 3*b* fixed to printed board 1 is connected to the positive electrode of nickel-hydrogen storage battery 11. When the bidirectional switch device is used for second switch device SW2, first bus bar 3*a* fixed to printed board 1 is connected to the node of power supply line L1 closer to nickel-hydrogen storage battery 11, and second bus bar 3*b* fixed to printed board 1 is connected to the node of power supply line L1 closer to lead storage battery 13.

Management device 12 monitors the state of nickel-hydrogen storage battery 11 by monitoring a voltage, current, and temperature of nickel-hydrogen storage battery 11, thereby controlling charging and discharging of nickel-hydrogen storage battery 11. Specifically, management device 12 controls an SOC and a state of health (SOH) of nickel-hydrogen storage battery 11 based on a voltage, current, and temperature. In addition, when detecting overvoltage, undervoltage, overcurrent, or abnormal temperature, management device 12 turns off first switch device SW1 to stop charging and discharging. To electrically disconnect lead storage battery 13 from nickel-hydrogen storage battery 11, management device 12 turns off second switch device SW2 to disconnect lead storage battery 13 and nickel-hydrogen storage battery 11 from each other.

A bidirectional current flows through first switch device SW1 and second switch device SW2, and therefore, a mechanical relay has been popularly used. However, the mechanical relay has a physical contact, and therefore, noise is generated upon switching. In view of this, the bidirectional switch device having first semiconductor switch element 2*a* and second semiconductor switch element 2*b* is used, whereby noise upon switching can be reduced. In addition, the bidirectional switch device is reinforced at the joint portion between the bus bars and the printed board, and thus, is resistant to vibrations and impacts. Therefore, even when the mechanical relay is replaced by the semiconductor switch, reliability equivalent to the reliability of the mechanical relay can be achieved.

The present invention has been described based on the exemplary embodiment. The above exemplary embodiment is intended to be illustrative only, and the person of ordinary skill in the art will understand that various modifications are possible for the combination of configuration elements and processing processes in the exemplary embodiment and that such modifications are also within the scope of the present invention.

For example, a plurality of series circuits each including first semiconductor switch element 2*a* and second semiconductor switch element 2*b* may be disposed in parallel on printed board 1 to increase a current capacity of the semiconductor switches. In addition, printed board 1 may be configured to have multiple layers, and first drain terminal 7a of first semiconductor switch element 2a and first soldered part 6a to which the bent parts of first bus bar 3a are attached may be electrically connected via a plurality of conductive layers which are insulated from each other. Similarly, the other conductive portions may be electrically connected via a plurality of conductive layers. With this configuration, a current flow area is increased, and a current capacity is increased.

The above exemplary embodiment describes printed board 1 mounted with the bidirectional switch in which first semiconductor switch element 2a and second semiconductor switch element 2b are connected in series. However, the technique in the present invention is also applicable to printed board 1 mounted with a unidirectional switch constituted by a single semiconductor switch element. In such a case, first bus bar 3a is connected to a drain terminal of the semiconductor switch element, and second bus bar 3b is connected to a source terminal.

The above exemplary embodiment describes an example where a MOSFET is used for first semiconductor switch element 2a and second semiconductor switch element 2b. However, other semiconductor switch elements such as an insulated gate bipolar transistor (IGBT) may be used in place of the MOSFET.

Further, electric components to be mounted on printed board 1 to which first bus bar 3a and/or second bus bar 3b is connected are not limited to semiconductor switch elements. The technique in the present invention is also applicable to printed board 1 on which other electric components, such as an amplifier, are mounted.

The exemplary embodiment may be specified by items described below.

[Item 1]

A method for connecting bus bar (3a, 3b) to a wiring pattern of printed board (1), the method comprising:
screwing bus bar (3a, 3b) to printed board (1); and
soldering bus bar (3a, 3b) that has been screwed to printed board (1) to the wiring pattern of printed board (1).

With this configuration, bus bar (3a, 3b) can be firmly connected to printed board (1). Further, this configuration can prevent a positional misalignment, which may occur when soldering is performed first, between a screw hole in bus bar (3a, 3b) and a screw hole in printed board (1).

[Item 2]

Printed board (1) to which bus bar (3a, 3b) is connected, wherein
bus bar (3a, 3b) is soldered to a wiring pattern, and bus bar (3a, 3b) is screwed to printed board (1).

With this configuration, bus bar (3a, 3b) can be firmly connected to printed board (1).

[Item 3]

Printed board (1) according to Item 2, wherein
a tip of bolt (4a, 4b) passing through a hole in bus bar (3a, 3b) and a hole in printed board (1) is tightened using nut (5a, 5b), and
the hole in printed board (1) is electrically connected to the wiring pattern.

With this configuration, a mechanical joint strength between bus bar (3a, 3b) and printed board (1) can be ensured.

[Item 4]

A switch device comprising:
printed board (1);
semiconductor switch element (2a) mounted on printed board (1);

first bus bar (3a) that is soldered to a wiring pattern to which a terminal of semiconductor switch element (2a) is connected, first bus bar (3a) being screwed to printed board (1); and
second bus bar (3b) that is soldered to a wiring pattern to which another terminal of semiconductor switch element (2a) is connected, second bus bar (3b) being screwed to printed board (1).

With this configuration, a switch device in which bus bar (3a, 3b) is firmly connected to printed board (1) can be constructed.

[Item 5]

A switch device comprising:
printed board (1);
first semiconductor switch element (2a) mounted on printed board (1);
second semiconductor switch element (2b) mounted on printed board (1);
first bus bar (3a) that is soldered to a wiring pattern to which drain terminal (7a) or source terminal (8a) of first semiconductor switch element (2a) is connected, first bus bar (3a) being screwed to printed board (1); and
second bus bar (3b) that is soldered to a wiring pattern to which drain terminal (7b) or source terminal (8b) of second semiconductor switch element (2b) is connected, second bus bar (3b) being screwed to printed board (1),
wherein source terminals (8a, 8b) or drain terminals (7a, 7b) of first semiconductor switch element (2a) and second semiconductor switch element (2b) are connected to each other.

With this configuration, a bidirectional switch device in which bus bar (3a, 3b) is firmly connected to printed board (1) can be constructed.

[Item 6]

The switch device according to Item 5, wherein first bus bar (3a) is connected to power supply line (L1) for supplying power to load (14, 16) in a vehicle, and
second bus bar (3b) is connected to power storage device (11) mounted in the vehicle.

With this configuration, the switch device can be used in a vehicle-mounted power supply system.

The invention claimed is:

1. A switch device comprising:
a printed board;
a first semiconductor switch element mounted on the printed board;
a second semiconductor switch element mounted on the printed board;
a first bus bar that is soldered to a wiring pattern to which a drain terminal or a source terminal of the first semiconductor switch element is connected, the first bus bar being screwed to the printed board; and
a second bus bar that is soldered to a wiring pattern to which a drain terminal or a source terminal of the second semiconductor switch element is connected, the second bus bar being screwed to the printed board,
wherein the source terminals or the drain terminals of the first semiconductor switch element and the second semiconductor switch element are connected to each other,
wherein
each of the first and second bus bars includes a straight-shape part extending in a first direction, the straight-shape part having a bend part at a tip and a hole away from the bend part in the first direction,
the bent part of the first bus bar is inserted into a first hole in the printed board, the first hole having a shape of a long hole extending in a second direction substantially orthogonal to the first direction, and the bent part of the second bus bar is inserted into another first hole in the printed board, the another first hole having a shape of a long hole extending in the second direction substantially orthogonal to the first direction.

2. The switch device according to claim 1, wherein the first bus bar is connected to a power supply line for supplying power to a load in a vehicle, and the second bus bar is connected to a power storage device mounted in the vehicle.

* * * * *